(12) United States Patent
Lefevre

(10) Patent No.: US 6,339,609 B2
(45) Date of Patent: Jan. 15, 2002

(54) TUNABLE LASER SOURCE WITH A SELF-ALIGNED EXTERNAL CAVITY AND A RETRO-REFLECTING-DISPERSING DEVICE

(75) Inventor: Hervé Lefevre, Paris (FR)

(73) Assignee: Photonetics, Marly le Roi (FR)

(*) Notice: Subject to any disclaimer, the term of this patent is extended or adjusted under 35 U.S.C. 154(b) by 0 days.

(21) Appl. No.: 09/765,587

(22) Filed: Jan. 22, 2001

Related U.S. Application Data

(63) Continuation of application No. 09/503,204, filed on Feb. 14, 2000, now Pat. No. 6,252,718.

(30) Foreign Application Priority Data

Feb. 15, 1999 (FR) .............................................. 99 01788

(51) Int. Cl.[7] .................................................. H01S 3/08
(52) U.S. Cl. ............................. 372/99; 372/102; 372/94
(58) Field of Search .............................. 372/92–94, 98, 372/99, 101, 102, 107, 108; 356/333, 334, 305, 326, 328

(56) References Cited

U.S. PATENT DOCUMENTS

| 5,594,744 A | * | 1/1997 | Lefevre et al. ............... 372/20 |
| 5,886,785 A | * | 3/1999 | Lefevre et al. ............. 356/328 |
| 6,177,992 B1 | * | 1/2001 | Braun et al. ................ 356/327 |

* cited by examiner

*Primary Examiner*—James W. Davie
*Assistant Examiner*—Davienne Monbleau
(74) *Attorney, Agent, or Firm*—Arent Fox Kintner Plotkin & Kahn

(57) ABSTRACT

Optical reflector for receiving an input beam and transmitting a retro-reflected reciprocal output beam. The optical reflector includes a beam splitter for splitting the input beam into first and second secondary beams. The first and second secondary beams being parallel to one another. A reflecting system is also included for redirecting the first and second secondary beams toward the beam splitter. The reflecting system including a total reflector. The beam splitter and the reflecting system are self-aligned.

20 Claims, 3 Drawing Sheets

US 6,339,609 B2

1

TUNABLE LASER SOURCE WITH A SELF-ALIGNED EXTERNAL CAVITY AND A RETRO-REFLECTING-DISPERSING DEVICE

CROSS-REFERENCE TO RELATED APPLICATIONS

This application is a continuation of U.S. application Ser. No. 09/503,204, filed Feb. 14, 2000 now U.S. Pat. No. 6,252,918 and claims priority benefits under 35 U.S.C. 119 to French application 99/01788, filed Feb. 15, 1999.

FIELD OF THE INVENTION

This invention relates to an optical reflector intended for receiving an input beam and transmitting a reverse-direction and parallel output beam, optionally superimposed on the input beam.

BACKGROUND OF THE INVENTION

It is well known that the alignment of the optical components is decisive for the quality of the devices that are fitted with the components. Therefore, any self-alignment, i.e. any assembly in which the properties of the output luminous flux are little sensitive to the orientation or to the position of one or several components, is required.

Among the self-aligned retroreflecting systems known for a long time, the following can be mentioned for exemplification purposes: the cube corner illustrated on FIG. 1 with which an incident beam 1, 1', on a reflecting orthogonal trihedron 3 produces a parallel output beam 2, 2', whatever the angle of incidence with respect to the diagonal 5 of the cube and the position of the point of incidence 4.

The so-called 'cat's eye' assembly is also well known, consisting of a convergent optical system 8 with optical axis 9, in the focal plane of which is located a mirror 10, substantially perpendicular to the axis 9. A collimated incident beam 11, 11' converges onto the mirror 10, is reflected on the mirror 10 and then diverges in return onto the optical system 8 that produces an output beam 12, 12', also collimated and parallel to 11. Such a cat's eye is represented on FIG. 2.

Both these systems described previously offer self-alignment of the direction of the output beam 2, 2' and 12, 12' on the input beam, respectively 1, 1' and 11, 11' in two dimensions, i.e. in all the planes parallel to the direction of the input beams. In certain systems, one can seek to obtain the self-alignment in a single dimension. In this case, one can use either an orthogonal dihedron instead of the trihedron of FIG. 1 or a cylindrical cat's eye, i.e. a lens or a cylindrical optical system instead of the spherical optical system 8 in the case of FIG. 2.

The dihedron ensures self-alignment in the plane perpendicular to its edge and the cylindrical cat's eye in the plane perpendicular to the generatrix of its cylindrical lens. In the parallel plane, both these systems behave like a mirror.

Self-aligned separating optical components or devices, which produce two emerging beams, parallel to one another, from a single incident beam, are also known. These may be for instance a periscope or a blade with parallel faces one of which is partially metallized, in order to modify its reflection coefficient on a portion of its surface.

Conventional dihedra and trihedra allow however only total reflection of the beam whereas, in certain applications, a second partial output is required in addition to the first retroreflected output.

SUMMARY OF THE INVENTION

The invention implements an interferometric device of the Sagnac interferometer type, capable of producing two

2 beams, respectively identified as a reciprocal beam and a non-reciprocal beam, in relation to the number of reflections affecting each of the two interfering beams to make the output beams.

The Sagnac interferometers are well known. They consist of a beam splitter and a ring, i.e. a closed optical beam beginning and ending at the beam splitter.

This ring and the beam splitter are arranged so that an input beam is split into two secondary beams, each circulating in the ring, respectively in opposite directions.

Thus, when returning, the waves corresponding to each of these beams interfere and produce two output beams.

This ring often consists of three independent mirrors and it is well known that a reciprocal output is thus produced for which the interfering waves have been subjected to the same number of reflections during their circulation in the ring and a non-reciprocal output for which these waves have been subjected to a number of different reflections.

By 'matched phase front', we mean the state of interference obtained when the orientation of the mirrors is adjusted to spread the interferences fringes down to their complete elimination.

The aim of the invention is to provide such a Sagnac interferometer comprising an optical reflector, that benefits from the advantages of a self-aligned reflecting device and that would be then particularly simple to adjust and whose long-term stability is improved.

Another advantage of the invention is to allow the possible construction of wavelength tuneable laser, possibly continuously, that would enable extracting the output luminous beam in optimised conditions, with minimum losses.

According to another embodiment of the invention, it is possible to obtain a laser whose background noise resulting from the ASE (Amplified Spontaneous Emission) is filtered spectrally and that exhibits therefore better efficiency at the emission wavelength of the laser.

The invention also relates to an optical reflector receiving an input beam, transmitting a retroreflected reciprocal output beam and comprising a beam splitter giving a first secondary beam and a second secondary beam, parallel to one another as well as retroreflecting system each redirecting the secondary beams toward the beam splitter and forming a Sagnac interferometer.

According to the invention, the reflecting system comprises a self-aligned total reflector and the beam splitter is self-aligned.

Preferably, in various embodiments of the invention each having their respective advantages:

the self-aligned total reflector is unidimensional;
the self-aligned total reflector is bidimensional;
the beam splitter is energy-unbalanced, whereas the reflector thus transmits a non-reciprocal output beam;
the optical reflector comprises a diffraction grating forming with the total reflector a Littman-Metcalf system;
the diffraction grating is located between the beam splitter and the total reflector.

The invention also relates to a laser source with external cavity comprising an amplifier medium and a retroreflecting dispersing device comprising an optical reflector formed by a Sagnac interferometer with a total reflector and a Littman-Metcalf configuration grating.

Advantageously:

the amplifier medium is a wave-guide and it is associated with collimation optics thereby collimating the beam that it produces;

the external face of the wave-guide is totally reflecting and the non-reciprocal beam is the single beam transmitted by the source;

the dihedron is mobile in rotation to enable the variation of the wavelength;

the dihedron is mobile in rotation and in translation to enable continuous variation of the wavelength;

the laser source comprises several amplifier guides that are offset at an angle with respect to the retroreflecting-dispersing device and enabling the transmission of the source over several wavelengths.

BRIEF DESCRIPTION OF THE DRAWINGS

The invention will be described more in detail with reference to the appended drawings on which.

DETAILED DESCRIPTION OF THE INVENTION

Figure 1:
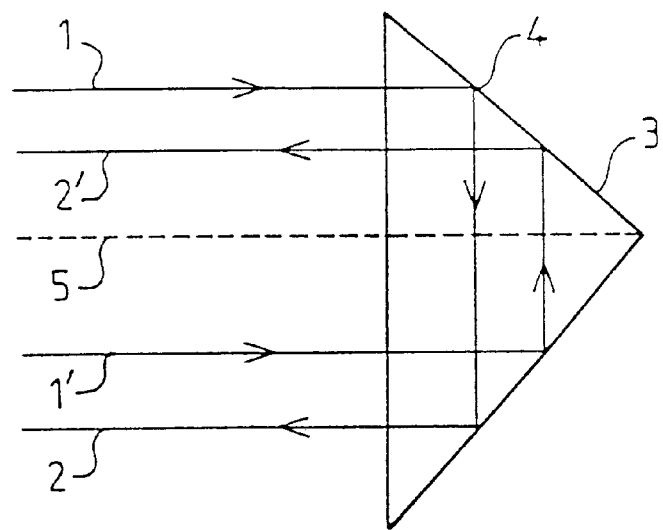
FIG. 1 represents a cube corner making up a two-dimension self-aligned device of the prior art.
Figure 2:
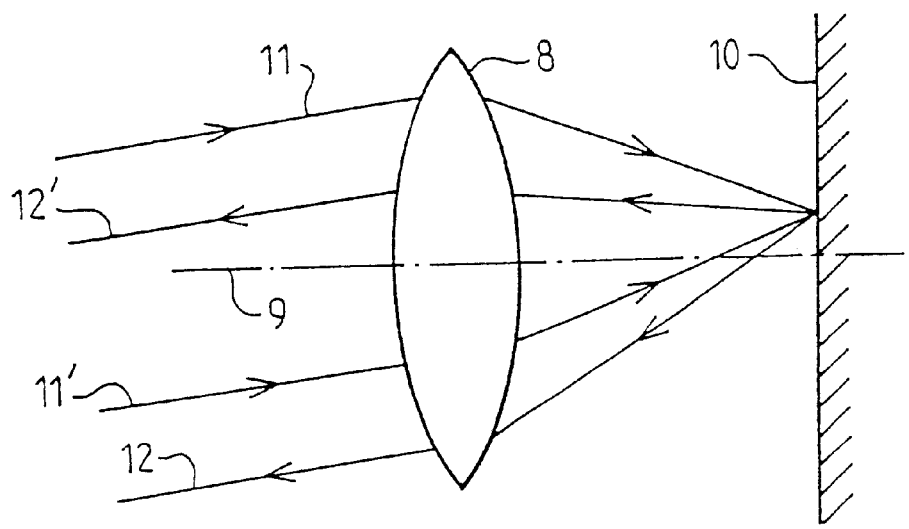
FIG. 2 represents a cat's eye making up a two-dimension self-aligned device of the prior art.
Figure 3:
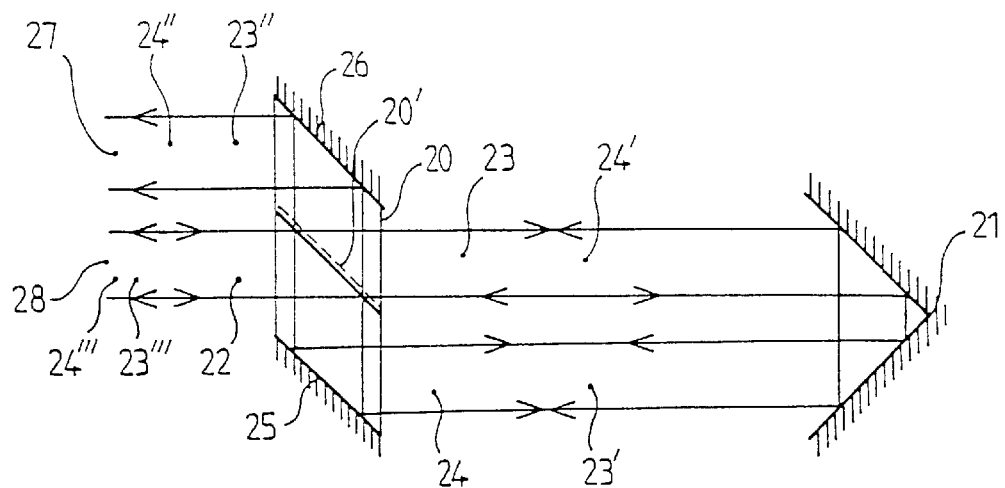
FIG. 3 is an optical reflector according to the invention.

The optical reflector represented on FIG. 3 comprises a beam splitter 20 and a self-aligned total reflector 21.

The self-aligned splitter 20 divides the input beam 22 into two parallel beams: i.e. a first split beam 23 and a second split beam 24 propagating through free space. The first split beam 23 is reflected by the self-aligned reflector 21 and forms a reflected split beam 23' that is directed to the beam splitter 20, that reflects it partially and transmits it partially. The transmitted beam 23" is sent back in parallel and in the reverse direction of the input beam 22.

The beam reflected by the splitter 20 is a beam 23'" superimposed and of reverse direction to the input beam 22. Similarly, the beam 24 generated from the input beam 22 by reflection onto the splitter 20, is itself reflected by the total reflector 21 and forms the beam 24' that is sent back to the splitter 20 that divides it into two beams, respectively 24" and 24'", which interfere with the beams 23" and 23'" thus generating two output beams, respectively 27 and 28, parallel to one another. The beam 28 is produced by interference of the beams 23'" and 24'" that have each been exposed to a single reflection on the splitter 20. This so-called reciprocal beam 28 is superposed to the input beam 22 and of reverse direction.

Conversely, the beam 27 is generated by the interferences of the beam 23' that has not been exposed to any reflection on the splitter 20 and of the beam 24' that has been exposed to two reflections on the same splitter. This difference in the number of reflections to which each beam is exposed, provides a n-radian phase shift and the output 27 is called a non-reciprocal output.

The device according to the invention is therefore an optical reflector that, from the input beam 22, generates two beams, respectively reciprocal 28 and non-reciprocal 27, parallel to one another and self-aligned on the input beam. The reciprocal beam 28 is superimposed to the input beam 22 whereas the non-reciprocal beam 27 is offset.

Implementing the self-aligned total reflector 21 facilitates the adjustment of the device and improves therefore its yield.

When the splitter 20 is a 50/50 splitter, the intensity of the split beams 23 and 24 is equal and during their recombination, the whole energy is gathered on the reciprocal output into one beam 28, whereby the beam 27, further to the phase shift between the waves of the beams 24" and 23", has a zero energy, i.e. the phase shift does not exist.

It is possible to use an energy-unbalanced splitter 20, enabling the distribution of the incident energy between both output beams 27 and 28. R and T being respectively the coefficients of energy reflection and transmission of the splitter 20, the incoming energy can be found at the non-reciprocal output (1–4 RT). For instance with R=90% and T=10%, we obtain (1–4 RT)=64% at the non-reciprocal output.

The self-aligned splitter 20 can be advantageously a periscopic splitter comprising a splitting interface 20' and two mirrors 25 and 26 that are parallel to the former.

The use of a diffraction grating 29, on the path of the luminous beam enables to spread geometrically the spectrum of the luminous fluxes at output and possibly to select a portion of the former.

This diffraction grating 29 is advantageously located in a Littman-Metcalf configuration between the self-aligned beam splitter 20 and the self-aligned total reflector 21.

Figure 4:
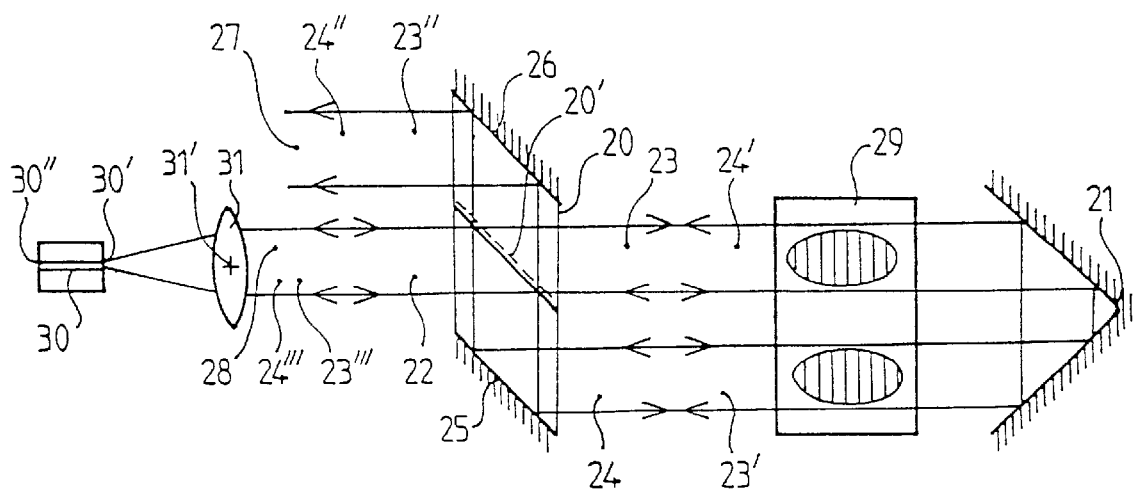
FIG. 4 is a side view of a laser according to the invention.
Figure 5:
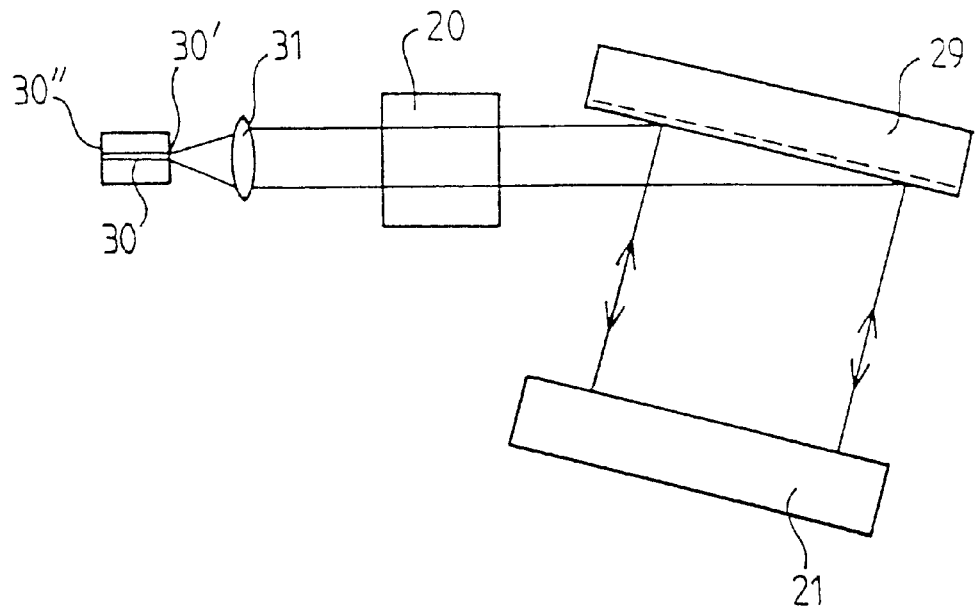
FIG. 5 is an above view of a laser according to the invention.

FIGS. 4 and 5 represent respectively the side view and the above view of a laser source according to the invention and, on these figures, the elements common to those of FIG. 3 have been kept with the same numeric references.

An amplifier medium, preferably an amplifier wave-guide 30, whose internal extremity 30' is placed at the focus of the collimation lens 31 of centre 31', generates the collimated input beam 22. The external face 30" of this amplifier wave-guide 30 is entirely reflecting, and the splitter 20 is unbalanced. Thus, a laser cavity is formed between the entirely reflecting face 30" and the self-aligned total reflector 21 through the reciprocal output where the beam 28 is superimposed to the input beam 22. The offset non-reciprocal output 27 makes up the laser output and forms therefore the transmitted beam.

The presence of a grating 29 in the Littman-Metcalf configuration with the self-aligned total reflector 21, in this laser source, enables the non-reciprocal output 27 to filter spectrally the continuous spurious background, with ASE radiation, and thereby to isolate the transmission line of the laser.

The transmission wavelength adjustment can be obtained either by rotating the grating or by rotating the total reflector 21 or still by rotating the assembly formed by the grating 29 and the total reflector 21, whereas the filtered non-reciprocal beam 27 remains stable since it is parallel to the input beam. This beam can be coupled optionally in a monomode optic fibre.

A rotation and/or translation coordinated movement of the reflecting dihedron 21 with the movement of the grating 29 enables to provide a continuous tuneable laser source. Such a coordinated movement is for example disclosed in French patent FR-2.724.496.

Such a laser source can also be made with several amplifier media or wave-guides 30 located in the focal plane of the lens 31. This allows us to provide a multiwavelength source, formed by the superimposition of several laser fluxes, each corresponding to a wave-guide and whose wavelength depends on the angle from which the said wave-guide can be seen from the reflecting dispersing device.

The figures and the description have been made while using as a self-aligned reflector, a cube corner or a dihedron, but similar results can be obtained by using a cat's eye. The cube corner and the dihedron can be formed by plane mirrors, but also made out of a full trihedron and a rectangular isosceles prism, operating in total internal reflection.

Figure 6:
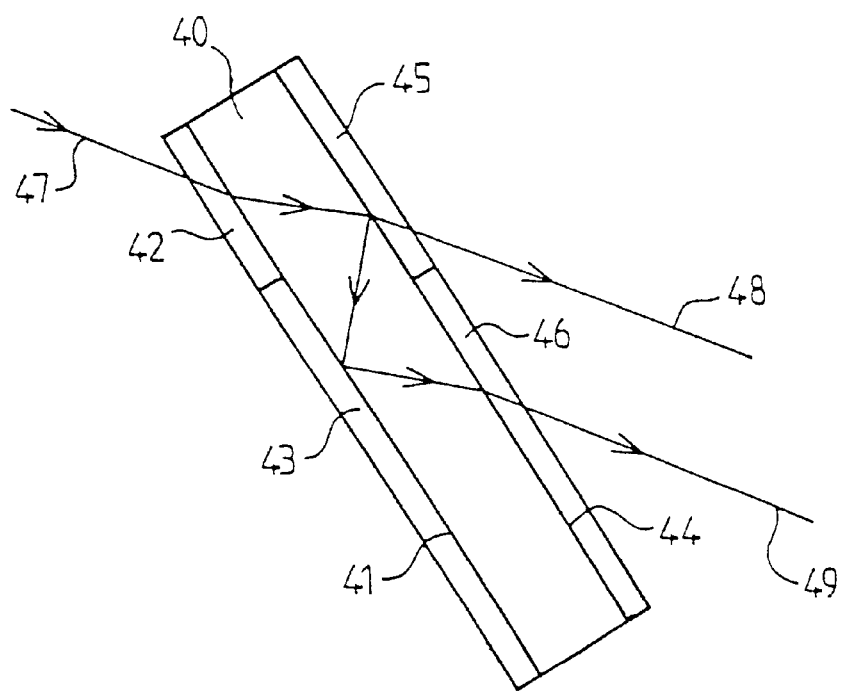
FIG. 6 represents a blade with parallel faces usable as a self-aligned beam splitter.

It has been mentioned above that the self-aligned splitter 20 can be a periscopic splitter. It can also be a blade with parallel faces. Such a blade 40 is represented on FIG. 6.

Its input face 41 is partially coated with an antiglare coating 42 and a fully reflecting coating 43.

Its output face 44 is partially coated with a partially reflecting coating 45 and, on another area, an antiglare coating 46.

Thus, an incident beam 47 is partially transmitted at 48 and the residual flux is transmitted, after two reflections at 49. The required function is thereby achieved.

What is claimed is:

1. A laser source comprising:
   an optical reflector receiving an input beam and transmitting a retro-reflected reciprocal output beam, the optical reflector comprising:
   a beam splitter splitting the input beam into first and second secondary beams, the first and second secondary beams being parallel to one another; and
   a reflecting system redirecting the first and second secondary beams toward the beam splitter, the reflecting system comprising a total reflector,
   wherein the beam splitter and the reflecting system are self-aligned.

2. The laser source of claim 1, further comprising a Littman-Metcalf system.

3. The laser source of claim 2, wherein the Littman-Metcalf system comprises a diffraction grating and the total reflector.

4. The laser source of claim 1, further including an external cavity comprising an amplifier medium.

5. The laser source of claim 1, further comprising a retro-reflecting-dispersing device.

6. The laser source of claim 5, further comprising a lens positioned optically between an amplifier medium and the beam splitter.

7. The laser source of claim 5, wherein the retro-reflecting-dispersing device is located between an amplifier medium and the total reflector.

8. The laser source of claim 7, wherein the retro-reflecting-dispersing device includes a diffraction grating located between the beam splitter and the total reflector.

9. The laser source of claim 4, further comprising a retro-reflecting dispersing device.

10. The laser source of claim 9, wherein the retro-reflecting dispersing device is located between an amplifier medium and the total reflector.

11. The laser source of claim 4, wherein the amplifier medium comprises a wave-guide.

12. The laser source of claim 11, further comprising a collimation optical device located between the wave-guide and the beam splitter.

13. The laser source of claim 11, further comprising a collimation optical device collimating the input beam.

14. The laser source of claim 12, wherein the wave-guide comprises an external face which is totally reflecting.

15. The laser source of claim 14, wherein the output beam comprises a non-reciprocal beam, the non-reciprocal beam being transmitted by the laser.

16. The laser source of claim 12, further comprising a retro-reflecting dispersion device and a plurality of amplifier guides which are offset at an angle with respect to the retro-reflecting dispersion device, wherein the plurality of amplifier guides enable the laser to transmit the input beam over a plurality of wavelengths.

17. The laser source of claim 1, wherein the reflection system comprises a dihedron which is rotatable for varying a wavelength.

18. The laser source of claim 17, wherein the dihedron is moveable towards and away from the beam splitter so as to continuously vary the wavelength.

19. The laser source of claim 17, wherein the dihedron is moveable so as to vary the wavelength.

20. The laser source of claim 1, wherein the optical reflector is a Sagnac interferometer.

* * * * *